United States Patent [19]

Fazakerly et al.

[11] 4,208,635
[45] Jun. 17, 1980

[54] ACTIVE FILTER AND PHASE-LOCKED LOOP USING SAME

[75] Inventors: William B. Fazakerly, Saratoga; Daniel R. Hafeman, Sunnyvale, both of Calif.

[73] Assignee: Scientific Micro Systems, Inc., Mountain View, Calif.

[21] Appl. No.: 933,170

[22] Filed: Aug. 14, 1978

[51] Int. Cl.² .................... H03B 3/04; H04B 15/00
[52] U.S. Cl. .................................... 331/17; 328/155; 328/167; 331/25
[58] Field of Search ................ 331/17, 18, 25; 328/167, 155, 141, 133; 307/271, 233 R

[56] References Cited

U.S. PATENT DOCUMENTS

| 3,835,399 | 10/1974 | Holmes | 328/167 |
| 4,015,224 | 3/1977 | Benzinger | 328/167 |
| 4,118,674 | 10/1978 | Ball | 331/17 |

FOREIGN PATENT DOCUMENTS 481981 11/1975 U.S.S.R. .................... 328/167

OTHER PUBLICATIONS

Gill et al., "Use IC's in Your Phase-Locked Loop", Electronic Design 8, Apr. 11, 1968, pp. 76–79.

Primary Examiner—Siegfried H. Grimm
Assistant Examiner—Edward P. Westin
Attorney, Agent, or Firm—Flehr, Hohbach, Test, Albritton & Herbert

[57] ABSTRACT

A second order filter signal is derived in response to a phase comparison of two signals by selecting an input voltage from a reference voltage, a first voltage potential higher than the reference voltage, and a second voltage potential lower than the reference voltage depending on the phase error of the two signals. The input signal is applied to a loop filter including a non-inverting integrator and to a feed forward circuit. The outputs of the amplifier and feed forward circuit are summed and applied to an output terminal as the second order filter signal. An improved phase locked oscillator circuit is provided in which a digital phase comparator drives an active loop filter including a feed forward circuit and a non-inverting integrator.

16 Claims, 4 Drawing Figures

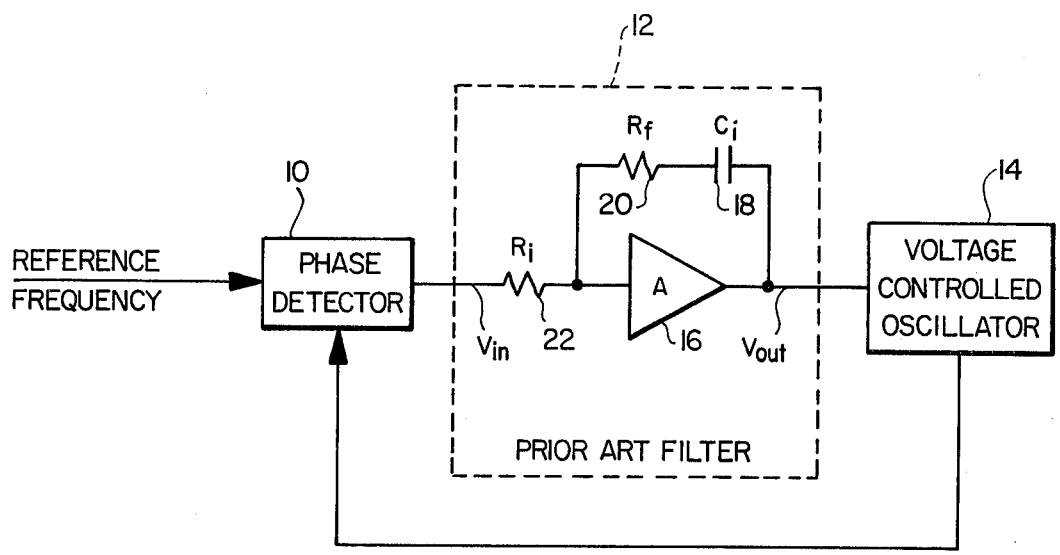
FIG__1
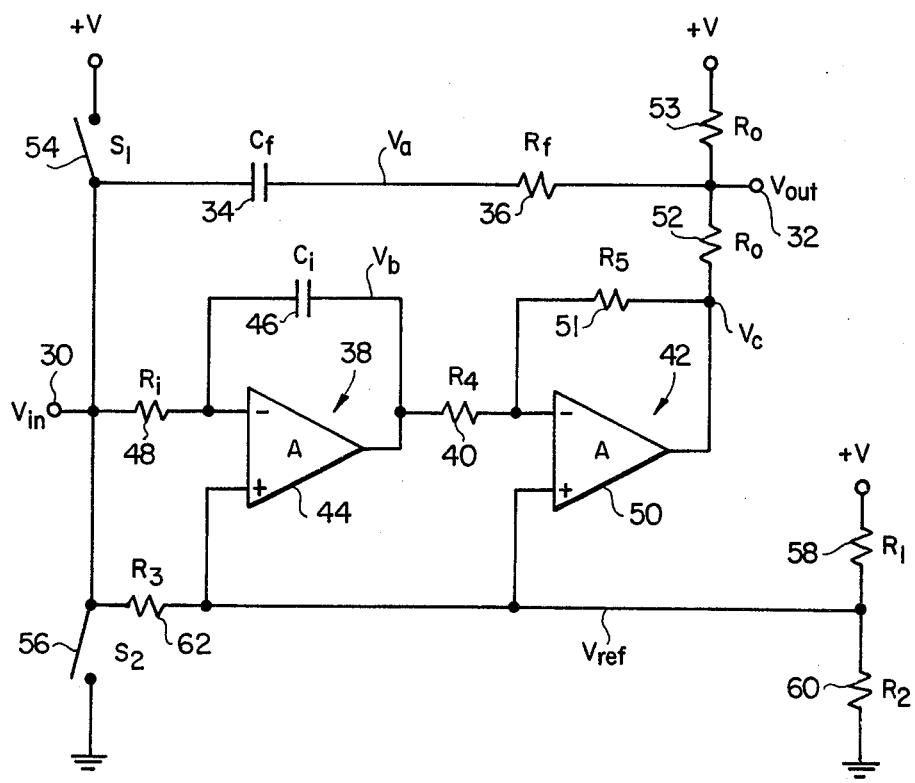
FIG__2

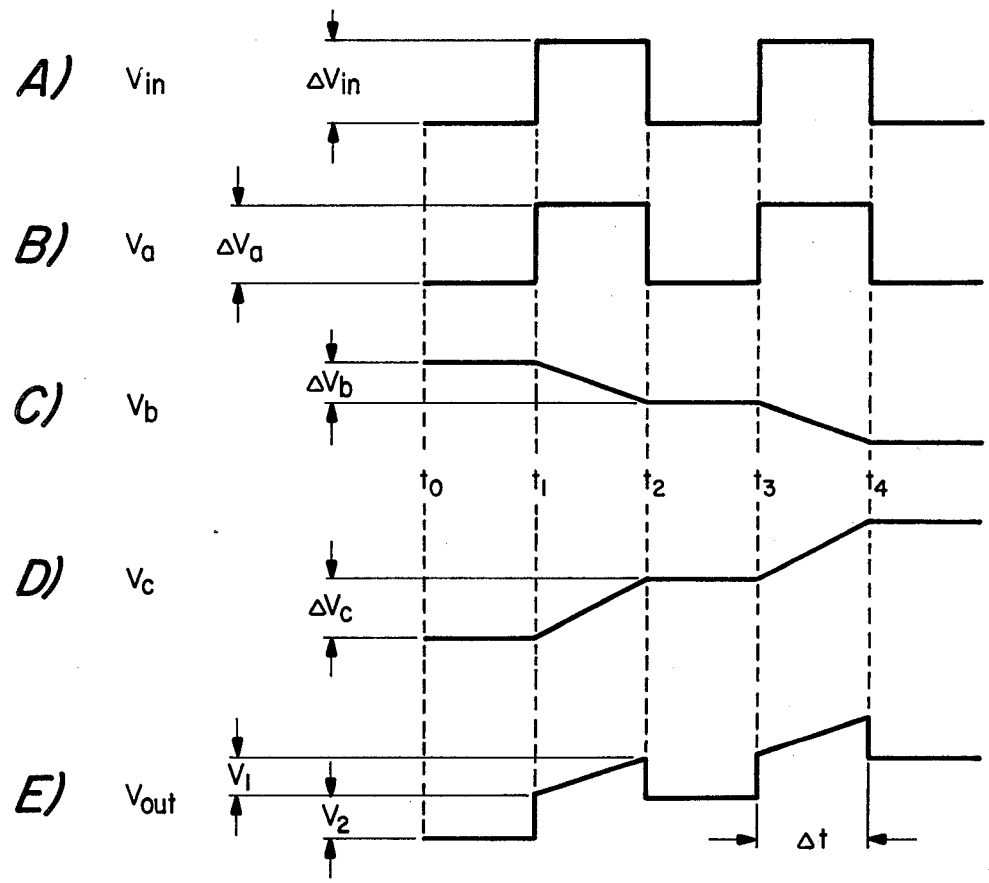
FIG__3
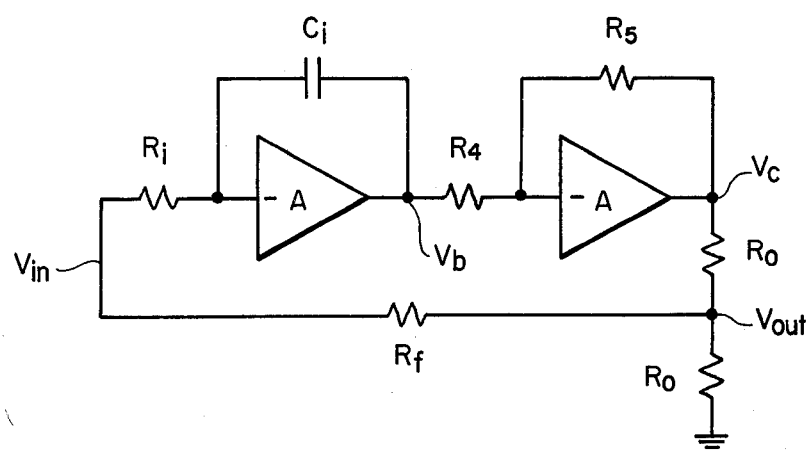
FIG__4

ACTIVE FILTER AND PHASE-LOCKED LOOP USING SAME

BACKGROUND OF THE INVENTION

This invention relates generally to electrical oscillator and filter circuits, and more particularly the invention relates to a phase locked oscillator and an active filter for use therein.

Voltage controlled oscillators operated in a phase locked loop in which an error signal is generated from a phase comparison of a reference signal and the oscillator output signal are well known. Typically, the error signal from a phase detector is applied to a second order loop filter circuit which generates a control voltage including one component which is directly related to the instantaneous value of the error signal and a second component which is related to the integral of the error signal. The first component is responsible for short term frequency or phase changes and is the primary factor determining the damping coefficient of the phase locked loop. The second component is responsible for long term frequency changes of the voltage controlled oscillator and is the primary factor determining the band-width of the phase locked loop.

The conventional filter using an operational amplifier works well with an analog phase detector since the phase detector output voltage is continually proportional to the phase error and rate of change of the output voltage is limited by the loop bandwidth. However, difficulties arise with a digital phase comparator since the output is a series of pulses with pulse duration being proportional to phase error. For the filter output to follow the pulses, a much higher filter slew rate must be available than that which would be required by loop bandwidth alone. If the pulses from the digital phase comparator are slew rate limited, phase adjustments are reduced and severe underdamping in the phase lock loop will result. Other problems attendant with the use of a digital phase detector with a conventional filter are balance and stability of the filter output. Balance between the error signals generated by positive and negative phase errors is important due to the integrating function of the loop filter. Any imbalance is translated into steady state phase error. Stability can be a problem since high impedance digital outputs can couple with the parasitic and input capacitance of the amplifier to produce a pole within the compensated amplifier bandwidth and result in spurious oscillations.

SUMMARY OF THE INVENTION

An object of the invention is an improved method of generating a second order filter signal from a pulsed input signal.

Another object of the invention is an improved active loop filter which is responsive to a pulsed input.

Another object of the invention is an improved phase locked oscillator including a digital phase detector.

Briefly, in accordance with the present invention a second order filter signal is derived in response to a pulsed error signal by applying as an input signal to a non-inverting integrator a reference voltage, a first voltage higher than the reference voltage, or a second voltage lower than the reference voltage depending on the error signal, applying the input signal to feed forward means, and summing the output signals from the non-inverting integrator and from the feed forward means.

The filter includes an input terminal and an output terminal and a non-inverting integrator connected therebetween. Means is provided for applying a reference voltage to the input terminal and means is provided for applying first and second voltage potentials to the input terminal. A feed forward coupling means is connected between the input terminal and the output terminal, and the output voltages from the non-inverting integrator and from the feed forward circuit are summed at the output terminal.

In accordance with one feature of the invention the non-inverting integrator comprises an inverting integrating amplifier circuit serially connected with an inverting voltage follower. In accordance with another feature of the invention the feed forward means comprises a capacitor serially connected with a resistor.

The filter is included with a digital phase detector and a voltage controlled oscillator in an improved phase-locked oscillator circuit.

The invention and objects and features thereof will be more fully understood from the following detailed description and appended claims when taken with the drawings.

BRIEF DESCRIPTION OF THE DRAWINGS

FIG. 1 is a schematic diagram of a prior art loop filter within a phase-locked loop.

FIG. 2 is a schematic diagram of a filter circuit useful in a phase-locked oscillator circuit in accordance with the present invention.

FIG. 3 is a representation of voltages in the filter of FIG. 2.

FIG. 4 is a frequency domain (ac) schematic diagram of the filter of FIG. 2.

DETAILED DESCRIPTION OF THE PREFERRED EMBODIMENTS

FIG. 1 is an electrical schematic diagram of a conventional phase-locked voltage controlled oscillator circuit including a phase detector 10, an active filter shown generally at 12, and a voltage controlled oscillator 14. Phase detector 10 compares the phase and frequency of an input reference signal with the phase and frequency of the voltage controlled oscillator 14 and in response to the comparison generates an error signal ($V_{in}$) which is applied to filter 12. Filter 12 responds to the error signal and generates a control voltage ($V_{out}$) for oscillator 14.

Conventionally, filter 12 may be a second order loop active filter including operational amplifier 16 with serially connected capacitor 18 ($C_i$) and resistor 20 ($R_f$) forming a feedback path from the output of amplifier 16 to its input. Resistor 22 ($R_i$) connects the error signal from phase detector 10 to the input of amplifier 16.

The error signal, $V_{in}$, generated by the phase detector is proportional to the phase error between the oscillator signal frequency and the input reference signal frequency. The output voltage, $V_{out}$, controls the variable frequency oscillator 14 and includes two components. The first component is due to the integration of charge on $C_i$ and is defined by the following equation:

$$V_1 = -(1/R_i C_i) \int_o^t v_{in}\, dt$$

The second component of the output voltage is a direct function of the input voltage $V_{in}$ as given by the following equation:

$$V_2 = -v_{in}(R_f/R_i)$$

The first component remains after the input voltage returns to zero as a result of the residual charge on $C_i$. This component is responsible for long term frequency changes of the voltage controlled oscillator and is the primary factor determining the bandwidth of the phase lock loop. The second component is present only when the input voltage is non-zero. This component is responsible for the short term frequency changes (phase adjustments), and is therefore the primary factor determining the damping coefficient of the phase locked loop.

As above described, the prior art filter is satisfactory when used with an analog phase detector since the phase detector output voltage is continually proportional to the phase error and its rate of change is limited by the loop bandwidth.

Phase locked loop oscillator circuits have encountered difficulties when digital phase detectors are employed since the output of the phase detector is a series of pulses with pulse duration proportional to phase error. The amplifier performance, in terms of slew rate and frequency response, must be sufficient to support this bandwidth. It is seen from the above that when the error signal, $V_{in}$, pulses, the output control voltage must also pulse since one component is proportional to the instantaneous error signal. For the conventional filter output to follow these pulses a much higher slew rate must be available than that which would be required by loop bandwidth alone. Moreover, if the pulses are slew rate limited, phase adjustments are reduced and severe underdamping results.

As further described above, the conventional prior art filter has balance and stability difficulties when used with digital phase detectors. Balance between the error signals generated by positive and negative phase errors is important due to the integrating property of the loop filter. Any imbalance is translated into steady state phase error. Stability becomes a problem since high impedance digital outputs in series with the resistor, $R_i$, can couple with parasitic and input capacitances of the amplifier to produce a pole within the compensated amplifier bandwidth. This pole can cause a 180° phase shift before the gain has been rolled off to unity and result in spurious oscillation.

These difficulties are overcome with the loop filter circuit in accordance with the present invention. One embodiment of the loop filter is illustrated in the electrical schematic of FIG. 2. Connected between the $V_{in}$ terminal 30 and the $V_{out}$ terminal 32 is a feed-forward circuit comprising serially connected capacitor 34 ($C_f$) and resistor 36 ($R_f$), and also a non-inverting integrator amplifier means including a first stage inverting integrator 38 which is serially connected through resistor 40 ($R_4$) to an inverting voltage follower 42. The feed-forward circuit passes the input signal to the output through a path independent of the non-inverting integrator means. Alternatively, an ohmic path, active switch under control of the input signal, or other means can be used in place of the serially connected capacitor and resistor to provide the independent feed forward path. The inverting integrator includes an amplifier 44 having a feedback capacitor 46 ($C_i$). A resistor 48 ($R_i$) interconnects one terminal of amplifier 44 to the $V_{in}$ terminal 30. Voltage follower 42 includes amplifier 50 having a feedback resistor 51 ($R_5$). Switches 54 and 56 connect the input terminal 30 to a $+V$ potential and to ground potential, respectively. Matched resistors 58 and 60 are serially connected between the $+V$ potential and ground and provide a reference potential ($V_{ref}$) which is connected to the input terminal 30 through resistor 62. For purposes of the following analysis, $V_a$ is the voltage between serially connecting capacitor 34 and resistor 36, $V_b$ is the voltage at the output of amplifier 44 and $V_c$ is the voltage at the output of amplifier 50.

Switches 54 and 56 are closed in response to the pulse output from the digital phase detector whereby switch 54 is closed during a phase error requiring an increase in oscillator frequency and switch 56 is closed when a decrease in oscillator frequency is required. The switches may comprise complementary transistors which are controlled by the phase error output pulses from the phase detector. For example, the Motorola MC4344 digital phase detector receives a reference source input and a VCO feedback input and generates two output signals in response to phase comparison of the input signals. One output signal is pulsed when the feedback signal lags the reference signal, and the other output signal is pulsed when the feedback signal leads the reference signal. In each case the average value of the resulting output waveform is proportional to the phase difference between the two inputs. The output signals can be used to control the two switches. The matched resistors 58 and 60 establish the reference potential ($V_{ref}$) midway between the $+V$ potential and ground. Since switches 54 and 56 are returned respectively to $+V$ and ground, the current in resistor 48 will be equal and opposite for opposite polarity phase errors, even with temperature and supply variations. Thus, an accurate balance results with no steady state phase error due to mismatch of opposite polarity error signals. Resistor 62 provides the amplifier with a low impedance source even when switches 54 and 56 are open. This ensures that any parasitic frequency response pole due to capacitance at the amplifier input is outside of the compensated amplifier unity gain bandwidth.

The capacitive feed-forward circuit including capacitor 34 and resistor 36 provides AC coupling of pulses, caused by the closing of switches 54 and 56, to the output terminal 32. Resistor 36 ($R_f$) and resistors 52 and 53 ($R_o$) form a voltage divider which is adjusted to set the proper amount of voltage change at terminal 32. This feed-forward voltage change corresponds to the damping component, $V_2$, of the filter described in FIG. 1.

Inverting integrator 38 is designed to provide a desired amount of integration for a chosen loop bandwidth. The inverting voltage follower 42 assures that the polarity of the integrated voltage is the same as the polarity of the feed-forward voltage and also adjusts the dynamic range of the output voltage, $V_{out}$, since the gain can be set greater than unity.

Operation of the filter shown in FIG. 2 is best described in the time domain. FIG. 3 shows the time domain waveforms for the node voltages of FIG. 2. Assume that switches 54 and 56 are open at time $T_0$. Under this condition $V_{in} = V_{ref}$. At $T_1$ the phase detector determines that a phase error exists and an increase in VCO frequency is required to reduce this error. The phase detector will then close switch 54 and therefore $V_{in} = +V$. The change in $v_{in}$ ($\Delta v_{in}$) is then $+V/2$ and $v_a$ will follow this change such that $\Delta v_a = \Delta v_{in} = +V/2$ as shown in FIG. 3b. The change in $v_a$ is reduced by the resistor divider formed by $R_f$ and $R_o$ and is summed into $v_{out}$ as shown by $v_2$ in FIG. 3e. Switch 54 remains closed from $t_1$ to $t_2$ (a period of $\Delta t$). During this time a current of $+V/2R_i$ flows and integrates charge onto $C_i$. The voltage change resulting from this integration is:

$$\Delta v_b = -1/C_i \int_{t_1}^{t_2} i\, dt$$
$$= -1/C_i \int_{t_1}^{t_2} \frac{\Delta v_{in}\, dt}{R_i}$$
$$= (-1/C_i)(\Delta v_{in}/R_i)(t_2 - t_1)$$

and is shown in FIG. 3c. The voltage follower 42 amplifies $v_b$ by a factor of $-R_5/R_4$ as shown by $v_c$ in FIG. 3d. $v_c$ is reduced by the $R_f$ and $R_o$ divider and is summed into $v_{out}$ as shown by $v_1$ in FIG. 3e.

The $v_1$ component of $v_{out}$ remains after switch 54 is opened at $t_2$. It is the component responsible for the longterm frequency changes required to maintain phaselock. Each time switch 54 closes, as between $t_3$ and $t_4$, the $v_1$ component increases the residual voltage at $v_{out}$ as shown in FIG. 3e. If, however, the loop could only achieve these longterm adjustments it would continually oscillate around the correct frequency, overshooting and undershooting without ever locking on. This is characteristic of a severely underdamped system and occurs with the conventional filter when the amplifier slew rate limitation prevents the output from making fast changes.

This underdamping is prevented without requiring high slew rate by the $v_2$ component of $v_{out}$. Since $v_2$ is only present while switch 54 or switch 56 is closed, short-term frequency changes, or phase changes, can be made without causing longterm frequency variations. This system damping allows the loop to make large phase adjustments and then resample the error.

Detailed analysis of the circuit can be performed best in the frequency domain. The results can then be put into the same form as the conventional filter so that conventional second order phase locked loop analysis can be used.

FIG. 4 is the frequency domain (small signal) model of the circuit. Like elements have the same reference numerals as in FIG. 2. All components which perform only dc functions have been removed from this model. The feed-forward capacitor, $C_f$, is not shown due to the assumption that it is chosen to ac couple the input and its zero-value time constant is outside the frequency range of interest. This is a valid assumption for most applications, however, analysis with $C_f$ is possible if required. The filter transfer function, F(s), is as follows:

$$V_{out}/R_o = (V_c - v_{out})/R_o + (v_{in} - v_{out})/R_f \quad (1)$$

$$v_{in}/R_i = -v_b sC_i => v_b = -v_{in}/sC_iR_i \quad (2)$$

$$v_b/R_4 = -v_c/R_5 => v_c = -v_b(R_5/R_4) \quad (3)$$

Let $R_5/R_4 \equiv G \equiv$ second stage follower gain; and substitute (2) into (3):

$$v_c = Gv_{in}/sC_iR_i \quad (4)$$

Rewriting (1) yields:

$$v_{out} = v_c - v_{out} + v_{in}R_o/R_f - v_{out}R_o/R_f \quad (5)$$

Now, substituting (4) into (5) yields:

$$v_{out} = Gv_{in}/sC_iR_i - v_{out} + v_{in}R_o/R_f - v_{out}R_o/R_f \quad (6)$$

$$v_{out}(2 + R_o/R_f) = v_{in}(G/sC_iR_i + R_o/R_f) \quad (7)$$

$$F(s) = v_{out}/v_{in} = (G/sC_iR_i + R_o/R_f)/(2 + R_o/R_f) \quad (8)$$

$$F(s) = [(GR_f + sC_iR_iR_o)/sC_iR_iR_f][R_f/(2R_f + R_o)] \quad (9)$$

$$F(s) = (GR_f + sC_iR_iR_o)/sC_iR_i(2R_f + R_o) \quad (10)$$

$$F(s) = (1 + sC_iR_iR_o/GR_f)/(sC_iR_i(2R_f + R_o)/GR_f) \quad (11)$$

Rewriting (11) in the form for the conventional second order phase locked loop filter yields:

$$F(s) = (1 + st_2)/st_1$$

where $$t_2 = C_iR_iR_o/GR_f$$

and $$t_1 = C_iR_i(2R_f + R_o)/GR_f$$

These time constants, $t_1$ and $t_2$, can be chosen in the known manner as the conventional filter to properly set the phase locked loop bandwidth and damping coefficient.

The loop filter and phase locked loop circuit in accordance with the present invention has proved successful in accepting a step change in frequency of ±4% and acquiring phase lock within approximately 100 microseconds. Under these conditions error pulses occurred every 2 microseconds with pulse duration varying from 0 to 375 ns. Circuits in accordance with the present invention significantly reduce the cost and space requirements compared with prior art circuits.

While the invention has been described with reference to specific embodiments, the description is illustrative and is not to be construed as limiting the scope of the invention. Various modifications, changes, and applications may occur to those skilled in the art without departing from the true spirit and scope of the invention as defined by the appended claims.

What is claimed is:

1. An active loop filter comprising
  (a) an input terminal,
  (b) an output terminal,
  (c) first and second voltage potentials,
  (d) means for generating a reference voltage,
  (e) means connecting said reference voltage,
  (e) means connecting said reference voltage to said input terminal,
  (f) first switch means for connecting said first voltage potential to said input terminal,
  (g) second switch means for connecting said second voltage potential to said input terminal,
  (h) feed forward means connected between said input terminal and said output terminal,
  (i) non-inverting integrator means, and
  (j) means connecting said non-inverting integrator means between said input terminal and said output terminal.

2. An active loop filter as defined by claim 1 wherein said non-inverting integrator means comprises an inverting integrating circuit serially connected with an inverting follower.

3. An active loop filter as defined by claim 2 wherein said feed forward means comprises a capacitor serially connected with a resistor.

4. An active loop filter as defined by claim 3 wherein said reference voltage means comprises first and second resistors serially connected between said first and second voltage potentials.

5. An active loop filter as defined by claim 4 and further including third and fourth resistors serially connected between said first voltage potential and the output of said non-inverting amplifier means, said output terminal being connected to the common terminal of said third and fourth resistors.

6. An active loop filter as defined by claim 1 wherein said feed forward means comprises a capacitor serially connected with a resistor.

7. A loop filter responsive to digital input signals comprising an input terminal and an output terminal, a non-inverting integrator means connecting said input terminal and said output terminal, means for selectively applying a reference potential, a first voltage potential or a second voltage potential to said input terminal in response to said digital input signals, and coupling means connected to said input terminal and said output terminal for coupling a signal to said output terminal in response to a signal at said input terminal, said signal from said coupling means being in addition to the signal from said non-inverting integrator means.

8. A loop filter as defined by claim 7 wherein said coupling means comprises capacitive feed forward means.

9. A loop filter as defined by claim 8 wherein said capacitive feed forward means comprises a capacitor serially connected with a resistor.

10. A loop filter as defined by claim 9 wherein said non-inverting integrator means comprises an inverting integrating amplifier circuit serially connected with an inverting voltage follower.

11. A loop filter as defined by claim 7 wherein said non-inverting integrator means comprises an inverting integrating amplifier circuit serially connected with an inverting voltage follower.

12. A phase locked oscillator circuit comprising a digital phase detector for phase comparing a reference signal and an oscillator feedback signal and generating an output pulse train with the pulse duration proportional to phase error, a loop filter for receiving said output pulse train and generating a control voltage, said loop filter including an input terminal and an output terminal, a non-inverting integrator means, means connecting said non-inverting integrator means to said input terminal and said output terminal, means for selectively applying a reference potential, a first voltage potential, or a second voltage potential to said input terminal in response to said output pulse train, and coupling means connected to said input terminal and said output terminal for coupling a signal to said output terminal in response to a signal at said input terminal, said signal from said coupling means being in addition to a signal from said non-inverting integrator means, a voltage controlled oscillator having an input terminal for receiving said control voltage and in response thereto generating an oscillation signal, and means for receiving said oscillation signal and generating said oscillator feedback signal for said phase detector.

13. A phase locked oscillator circuit as defined by claim 12 wherein said coupling means comprises capacitive feed forward means.

14. A phase locked oscillator circuit as defined by claim 13 wherein said non-inverting integrator means comprises an inverting integrating circuit serially connecting with an inverting voltage follower.

15. A phase locked oscillator circuit as defined by claim 12 wherein said non-inverting integrator means comprises an inverting integrator circuit serially connected with an inverting voltage follower.

16. The method of generating a filter signal in response to phase error between two signals comprising the steps of generating a pulse train with the pulse duration proportional to said phase error, selectively generating a filter input voltage from one of either of a reference voltage potential, a first voltage potential higher than said reference voltage potential, or a second voltage potential lower than said reference voltage potential in response to said pulse train,
applying said filter input voltage to a non-inverting integrator means,
applying said filter input voltage to feed forward coupling means, and
summing the output signals from said non-inverting integrator means and from said feed forward coupling means.

* * * * *